(12) United States Patent
Coteus et al.

(10) Patent No.: US 8,516,409 B2
(45) Date of Patent: Aug. 20, 2013

(54) IMPLEMENTING VERTICAL DIE STACKING TO DISTRIBUTE LOGICAL FUNCTION OVER MULTIPLE DIES IN THROUGH-SILICON-VIA STACKED SEMICONDUCTOR DEVICE

(75) Inventors: Paul W. Coteus, Yorktown, NY (US); Kyu-Hyoun Kim, Mount Kisco, NY (US); Robert B. Tremaine, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 12/944,020

(22) Filed: Nov. 11, 2010

(65) Prior Publication Data

US 2012/0124532 A1 May 17, 2012

(51) Int. Cl.
*G06F 17/50* (2006.01)

(52) U.S. Cl.
USPC ........... 716/101; 716/104; 716/105; 716/106; 716/110; 716/119

(58) Field of Classification Search
USPC .......................... 716/100–107, 110–111, 119
See application file for complete search history.

(56) References Cited

U.S. PATENT DOCUMENTS

| | | | |
|---|---|---|---|
| 2005/0010725 A1* | 1/2005 | Eilert | 711/132 |
| 2009/0013291 A1* | 1/2009 | Wang et al. | 716/5 |
| 2010/0023569 A1* | 1/2010 | Shiao et al. | 708/230 |
| 2010/0131684 A1* | 5/2010 | Johnson | 710/104 |
| 2010/0259296 A1* | 10/2010 | Or-Bach | 326/38 |
| 2010/0295600 A1* | 11/2010 | Kim et al. | 327/365 |
| 2011/0050320 A1* | 3/2011 | Gillingham | 327/365 |
| 2011/0110064 A1* | 5/2011 | Foster et al. | 361/803 |
| 2011/0121838 A1* | 5/2011 | Gillis et al. | 324/537 |
| 2011/0182423 A1* | 7/2011 | Lablans | 380/30 |
| 2011/0194326 A1* | 8/2011 | Nakanishi et al. | 365/51 |
| 2012/0019292 A1* | 1/2012 | Lu et al. | 327/143 |
| 2012/0096218 A1* | 4/2012 | Ahmad et al. | 711/103 |
| 2012/0194219 A1* | 8/2012 | Fish et al. | 326/103 |
| 2012/0221907 A1* | 8/2012 | Whetsel | 714/727 |
| 2012/0297262 A1* | 11/2012 | Whetsel | 714/729 |

* cited by examiner

*Primary Examiner* — Paul Dinh
(74) *Attorney, Agent, or Firm* — Joan Pennington

(57) ABSTRACT

A method and circuit for implementing die stacking to distribute a logical function over multiple dies, die identification and sparing in through-silicon-via stacked semiconductor devices, and a design structure on which the subject circuit resides are provided. Each die in the die stack includes predefined functional logic for implementing a respective predefined function. The respective predefined function is executed in each respective die and a respective functional result is provided to an adjacent die in the die stack. Each die in the die stack includes logic for providing die identification. An operational die signature is formed by combining a plurality of selected signals on each die. A die signature is coupled to a next level adjacent die using TSV interconnections where it is combined with that die signature.

4 Claims, 27 Drawing Sheets

402

| INPUT | | OUTPUT | |
|---|---|---|---|
| ID1[N] | ID0[N] | ID1[N+1] | ID0[N+1] |
| 0 | 0 | 0 | 1 |
| 0 | 1 | 1 | 0 |
| 1 | 0 | 1 | 1 |

DIE ID ADDRESS BITS
PER EACH DIE 406

| DIE  | ID2[N] | ID1[N] | ID0[N] |
|------|--------|--------|--------|
| DIE0 | 0      | 0      | 0      |
| DIE1 | 0      | 0      | 1      |
| DIE2 | 0      | 1      | 0      |
| DIE3 | 0      | 1      | 1      |
| DIE4 | 1      | 0      | 0      |

DIE ADDRESS REMAPPING
WITH DIE 2 DE-SELECTED

| EXTERNAL ADDRESS | | INTERNAL ADDRESS | | |
|---|---|---|---|---|
| EXTDIEADDR1 | EXTDIEADDR0 | DIEADDR2 | DIEADDR1 | DIEADDR0 |
| 0 | 0 | 0 | 0 | 0 |
| 0 | 1 | 0 | 0 | 1 |
| 1 | 0 | 0 | 1 | 1 |
| 1 | 1 | 1 | 0 | 0 |

DIE ID ADDRESS BITS
PER EACH DIE 406

| ID2[N] | ID1[N] | ID0[N] | DIEADDR1 & DIEADDR0 |
|--------|--------|--------|---------------------|
| 0 | 0 | 0 | '00' B |
| 0 | 0 | 1 | '01' B |
| 0 | 1 | 0 | '10' B |
| 0 | 1 | 1 | '11' B |
| 1 | X | X | NOT OPERATE |

SPARE INFORMATION STORED IN
FUSE 1406 OF MASTER 408

| DIE | ID2[N] | ID1[N] & ID0[N] |
|---|---|---|
| DIE0 | E-FUSE0 | '00' B |
| DIE1 | E-FUSE1 | DIE0, IF DIE0 IS NOT USED (ID2[0]='1') |
|  |  | DIE0 +1B, IF DIE0 IS USED (ID2[0]='0') |
| DIE2 | E-FUSE2 | DIE1, IF DIE1 IS NOT USED (ID2[1]='1') |
|  |  | DIE1 +1B, IF DIE1 IS USED (ID2[1]='0') |
| DIE3 | E-FUSE3 | DIE2, IF DIE2 IS NOT USED (ID2[2]='1') |
|  |  | DIE2 +1B, IF DIE2 IS USED (ID2[2]='0') |
| DIE4 | E-FUSE4 | DIE3, IF DIE0 IS NOT USED (ID2[3]='1') |
|  |  | DIE3 +1B, IF DIE3 IS USED (ID2[3]='0') |

EXAMPLE DIE 1 REPLACED WITH DIE 4

| DIE | ID2[N] | ID1[N] | ID0[N] | COMMENT |
|---|---|---|---|---|
| DIE0 | 0 | 0 | 0 | USED |
| DIE1 | 1 | 0 | 1 | NOT USED |
| DIE2 | 0 | 0 | 1 | USED |
| DIE3 | 0 | 1 | 0 | USED |
| DIE4 | 0 | 1 | 1 | USED |

FIG. 18

IMPLEMENTING VERTICAL DIE STACKING TO DISTRIBUTE LOGICAL FUNCTION OVER MULTIPLE DIES IN THROUGH-SILICON-VIA STACKED SEMICONDUCTOR DEVICE

FIELD OF THE INVENTION

The present invention relates generally to the data processing field, and more particularly, relates to a method and circuit for implementing stacking to distribute a logical function over multiple dies in through-silicon-via stacked semiconductor devices, and a design structure on which the subject circuit resides.

DESCRIPTION OF THE RELATED ART

Referring to FIGS. 1-3, there are shown Through-Silicon-Via (TSV) or TSV interconnections, which are widely used for various semiconductor chip stacking devices. Integrated circuit die stacking with packaging through silicon via (TSV) interconnections and other packaging techniques enable interconnecting die in ultra close proximity using the vertical dimension. Although these arrangements enable higher performance and packaging density, the constituent die and associated function typically are designed and used as a collection of independent die using conventional two-dimensional packaging techniques, despite being assembled in a unified inseparable module.

FIG. 1 illustrates an integrated circuit die stack including a bottom die master or controller, and upper dies 0-3 and a pair of TSVs extending through each die 0, die 1, die 2, and die 3. The TSVs interconnect all the dies in the die stack as illustrated in FIG. 1, including a respective TSV coupled to INPUT [0:M−1] and OUTPUT [0:N−1]. Typically some TSV also are required to send a signal, for example, a command to a specific die.

FIG. 2 illustrates an additional respective dedicated TSV for sending signals, for example, commands to a specific die, such as coupled to the select inputs SEL0, SEL1, SEL2, and SEL3 from a bottom die master or controller. FIG. 3 further illustrates a laser fuse arrangement for fuse cutting different dies differently with a respective laser fuse connected to a respective TSV, which is coupled to the select inputs SEL0, SEL1, SEL2, and SEL3 from the bottom die master or controller, which requires additional process or cost.

A need exists for an effective mechanism for implementing stacking to distribute a logical function over multiple dies, die identification and sparing in through-silicon-via stacked semiconductor devices.

SUMMARY OF THE INVENTION

Principal aspects of the present invention are to provide a method and circuit for implementing die stacking to distribute a logical function over multiple dies in through-silicon-via stacked semiconductor devices, and a design structure on which the subject circuit resides. Other important aspects of the present invention are to provide such method, circuit and design structure substantially without negative effects and that overcome many of the disadvantages of prior art arrangements.

In brief, a method and circuit for implementing stacking to distribute a logical function over multiple dies, die identification and sparing in through-silicon-via stacked semiconductor devices, and a design structure on which the subject circuit resides are provided. Each die in the die stack includes logic for implementing a respective predefined function. Each die executes the respective predefined function and provides a respective functional result to an adjacent die in the die stack.

In accordance with features of the invention, each die in the die stack includes logic for providing die identification. An operational die signature is formed by combining a plurality of selected signals on each die. A die signature is coupled to a next level adjacent die where it is logically combined with that die signature.

In accordance with features of the invention, the logic for providing die identification includes, for example, exclusive OR (XOR) logic for combining the plurality of selected signals on each die.

In accordance with features of the invention, the logic for providing die identification includes, for example, by shift register logic combining the plurality of selected signals on each die.

In accordance with features of the invention, when a de-selected die in the die stack is identified, a spare die in the die stack is used bypassing the identified de-selected die.

In accordance with features of the invention, spare die information is stored in a fuse coupled to sparing logic.

In accordance with features of the invention, the fuse storing the spare die information coupled to the sparing logic is provided on a master semiconductor device in the die stack.

BRIEF DESCRIPTION OF THE DRAWINGS

The present invention together with the above and other objects and advantages may best be understood from the following detailed description of a preferred embodiments of the invention illustrated in the drawings, wherein:

FIGS. 5, 6, and 7 illustrate example combination logic of the exemplary circuit of FIG. 4 in accordance with a preferred embodiment;

FIGS. 9, and 10 illustrate example address logic of the exemplary circuit of FIG. 8 in accordance with a preferred embodiment;

FIGS. 15, 16, 17, and 18 illustrate example logic of the exemplary circuit of FIG. 14 in accordance with a preferred embodiment;

DETAILED DESCRIPTION OF A PREFERRED EMBODIMENTS

Figure 1:
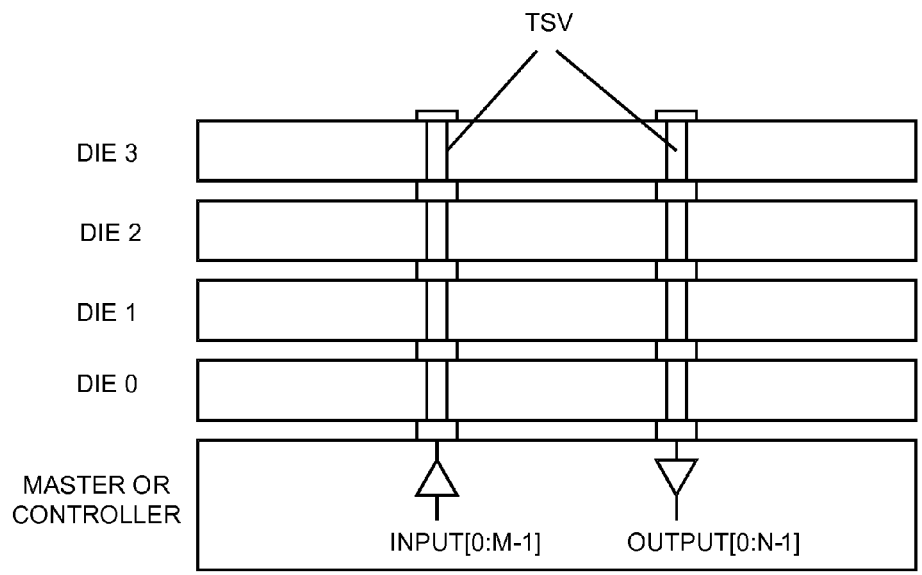
FIGS. 1-3 illustrate conventional prior art Through-Silicon-Via (TSV) arrangements used for various semiconductor chip stacking devices.
Figure 2:
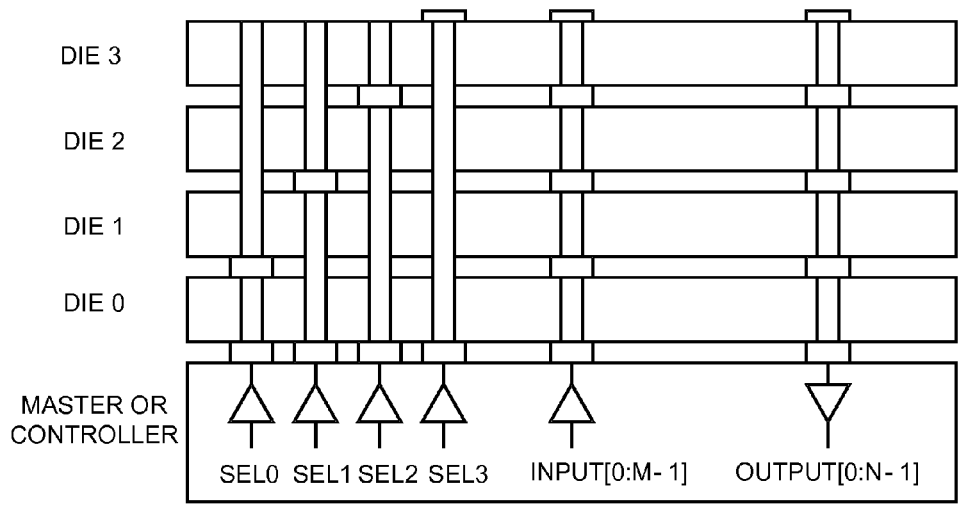
Figure 3:
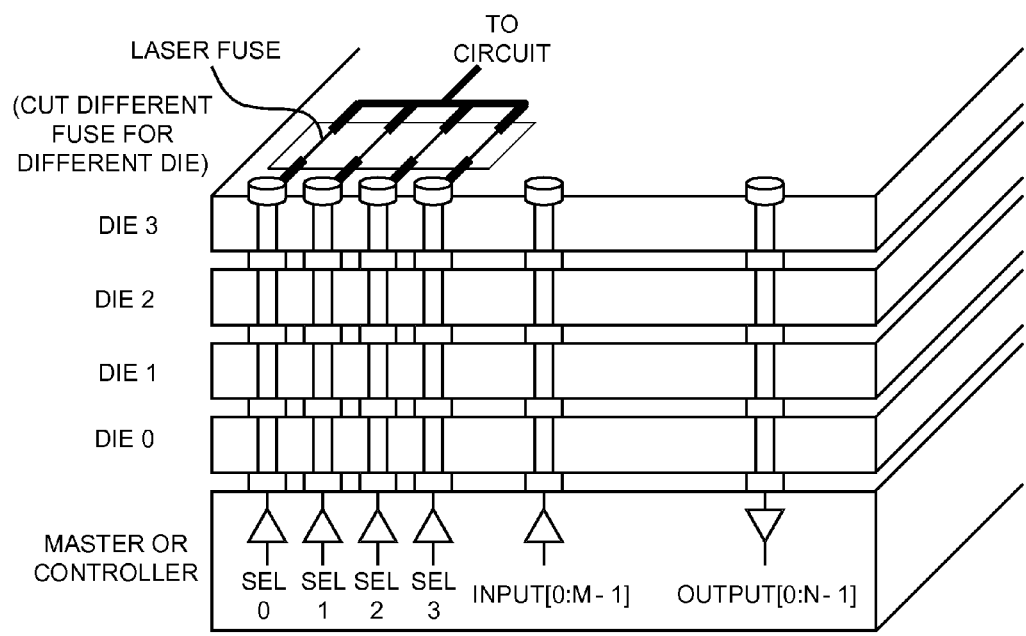

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings the same reference number are used in FIGS. 4-26 for identical or similar components or elements.

In accordance with features of the invention, a method and circuit for implementing die identification and sparing in through-silicon-via stacked semiconductor devices, and a design structure on which the subject circuit resides are provided. Spare die information is stored on a fuse coupled to sparing logic provided on a master semiconductor device in the die stack.

Figure 4:
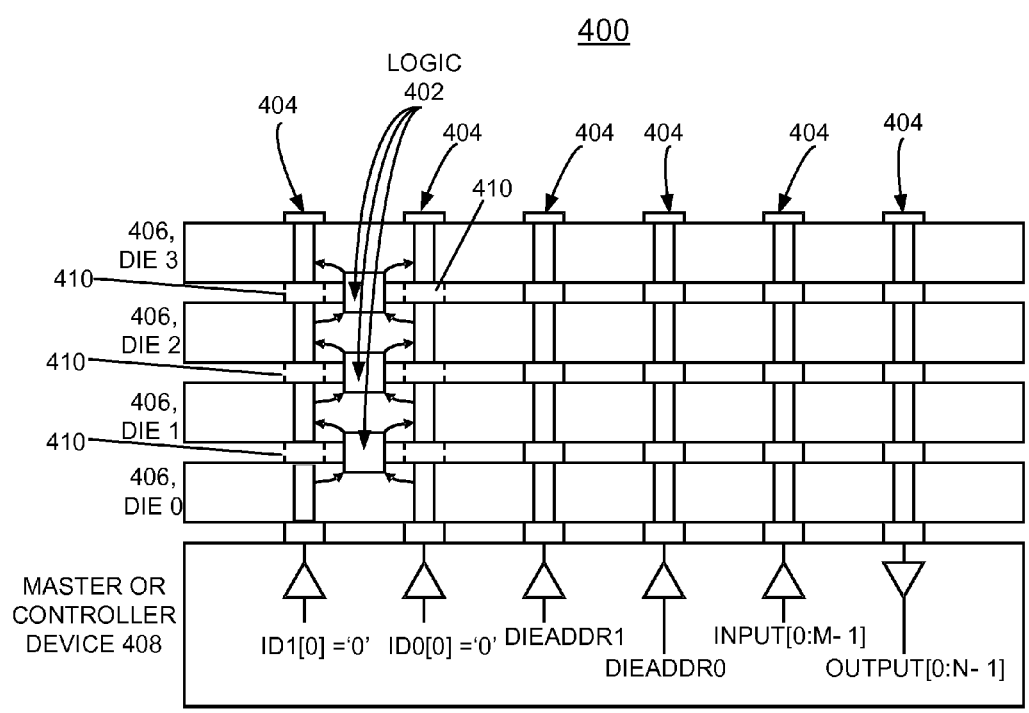
FIG. 4 schematically illustrates an exemplary circuit not to scale for implementing die identification in through-silicon-via stacked semiconductor devices in accordance with a preferred embodiment.

Having reference now to the drawings, in FIG. 4, there is shown an example circuit not to scale for implementing die identification in through-silicon-via stacked semiconductor devices generally designated by the reference character 400 in accordance with a preferred embodiment. Circuit 400 includes a distributed logic generally designated by the reference character 402 respectively connected with packaging through silicon via (TSV) interconnections by the reference character 404. The logic 402 is distributed across a respective independent stacked integrated circuit die 406, DIE 0, DIE 1, DIE 2, and DIE 3 with a bottom master or controller device 408 in the circuit 400.

Each die 406, DIE 0, DIE 1, DIE 2, and DIE 3 in the die stack of circuit 400 includes logic 402 for providing die identification. For example, each stacked integrated circuit die 406, DIE 0, DIE 1, DIE 2, and DIE 3 includes logic 402 containing an identical logic element contributing a partial solution based on state from the coupled die.

It should be understood that circuit 400 can include connections to a circuit board with interconnection pins providing the inputs and outputs or can terminate within the master or controller device 408, as shown. It should be understood that the master or controller device 408 may be identical to the stacked die, such as die 406, DIE 0, DIE 1, DIE 2, and DIE 3 or it may be a different die designed for a particular application as a master die or controller.

An operational die signature is formed by combining a plurality of selected signals on each die 406, DIE 0, DIE 1, DIE 2, and DIE 3 in circuit 400. A die signature is coupled from each respective die 406 to a next level adjacent die 406, for example, from die 406, DIE 0 to a next level adjacent 406, DIE 1, where it is logically combined with that die signature.

As shown, for example, a respective signal input ID1[0]='0' and ID0[0]='0' coupled from the bottom master or controller device 408 is applied to a pair of TSV interconnections 404 that include a dielectric layer 410 electrically separating respective adjacent dies 406, DIE 0, DIE 1, DIE 2, and DIE 3. Electrical connections to and from the pair of TSV interconnections 404 receiving respective signal input ID1[0]='0' and ID0[0]='0' and the logic 402 included in each die 406, DIE 0, DIE 1, DIE 2, and DIE 3 are indicated by arrows. A plurality of TSV interconnections 404 electrically connected to respective adjacent dies 406, DIE 0, DIE 1, DIE 2, and DIE 3 is connected to a respective signal input DIEADDR1, DIEADDR0, INPUT [0:M−1], and OUTPUT [0:N−1] applied from the bottom master or controller device 408.

Figure 5:
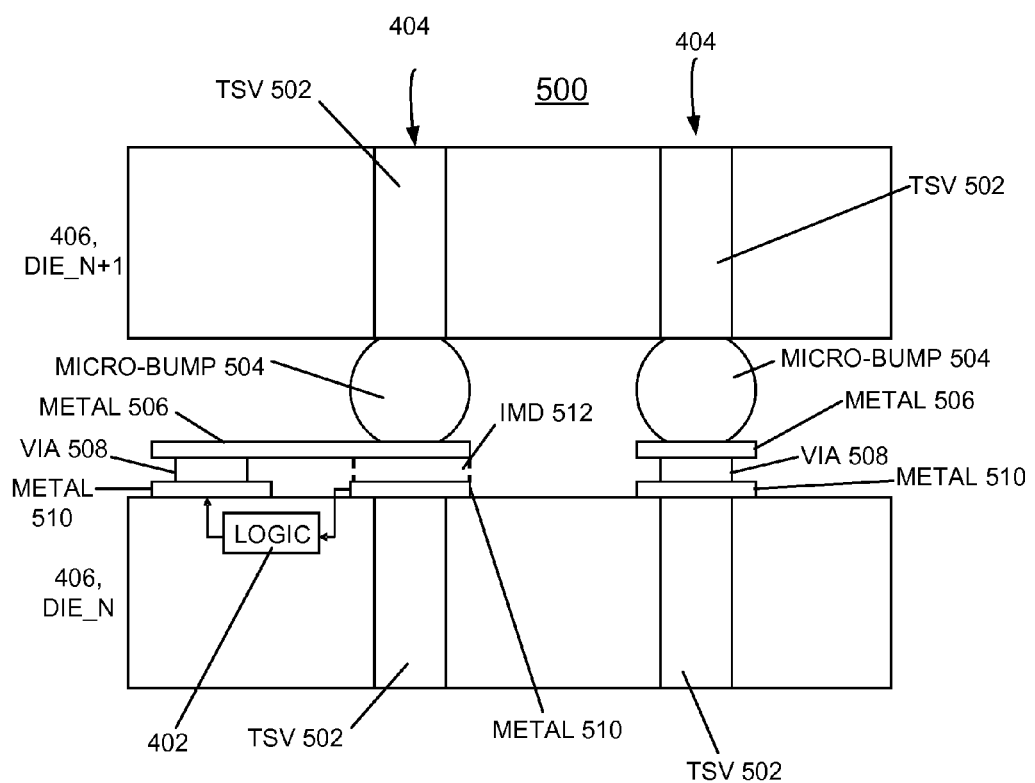
Figure 6:
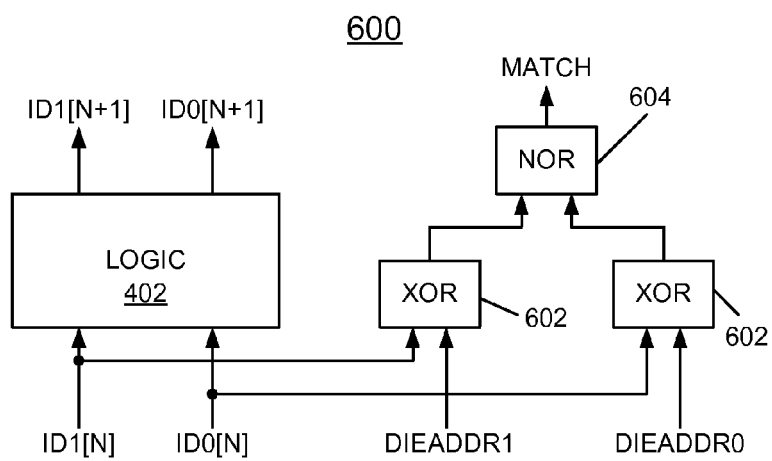

FIGS. 5, 6, and 7 illustrate example combination logic of the exemplary circuit 400 of FIG. 4 in accordance with a preferred embodiment. In FIG. 5, a pair of adjacent dies 406, DIE_N and 406, DIE_N+1 is shown with a portion of an example pair of TSV interconnections 404. As shown one TSV interconnection 404 with electrical connections to logic 402 included in die 406, DIE_N and one TSV interconnection 404 electrically connected between respective adjacent dies 406, DIE_N and 406, DIE_N+1. Each TSV interconnection 404 includes a respective TSV 502 extending through the illustrated adjacent dies 406, DIE_N and 406, DIE_N+1. A solder or micro-bump 504 connects the TSV 502 of 406, DIE_N+1 to an upper metal layer 506. In the TSV interconnection 404 electrically connected between the respective adjacent dies 406, DIE_N and 406, DIE_N+1 an electrically conductive via 508 connects the upper metal layer 506 to a lower metal layer 510 connected to the TSV 502 of the die 406, DIE_N. In the TSV interconnection 404 electrically separated by logic 402 between the respective adjacent dies 406, DIE_N and 406, DIE_N+1, an intermetal dielectric layer 512 electrically separates the upper metal layer 506 from the lower metal layer 510 connected to the TSV 502 of the die 406, DIE_N. Logic 402 is connected to the lower metal layer 510 connected to the TSV 502 of the die 406, DIE_N and a second, spaced apart lower metal layer 510 connected by an electrically conductive via 508 to the upper metal layer 506, which is connected by micro-bump 504 to the vertically aligned TSV 502 of 406, DIE_N+1.

Referring to FIG. 6, there is shown example combination logic generally designated by the reference character 600 including logic 402 receiving inputs ID1[N] and ID0[N] and providing outputs ID1[N+1] and ID0[N+1]. The combination logic 600 includes a pair of exclusive OR gates (XOR) 602 respectively receiving inputs ID1[N] and ID0[N] and a respective signal input DIEADDR1, DIEADDR0, and providing outputs to a NOR gate 604 to identify a match, as shown.

Referring to FIG. 7, there is shown example inputs ID1[N] and ID0[N] and outputs ID1[N+1] and ID0[N+1] provided by the logic 402 of FIG. 6.

Figure 8:
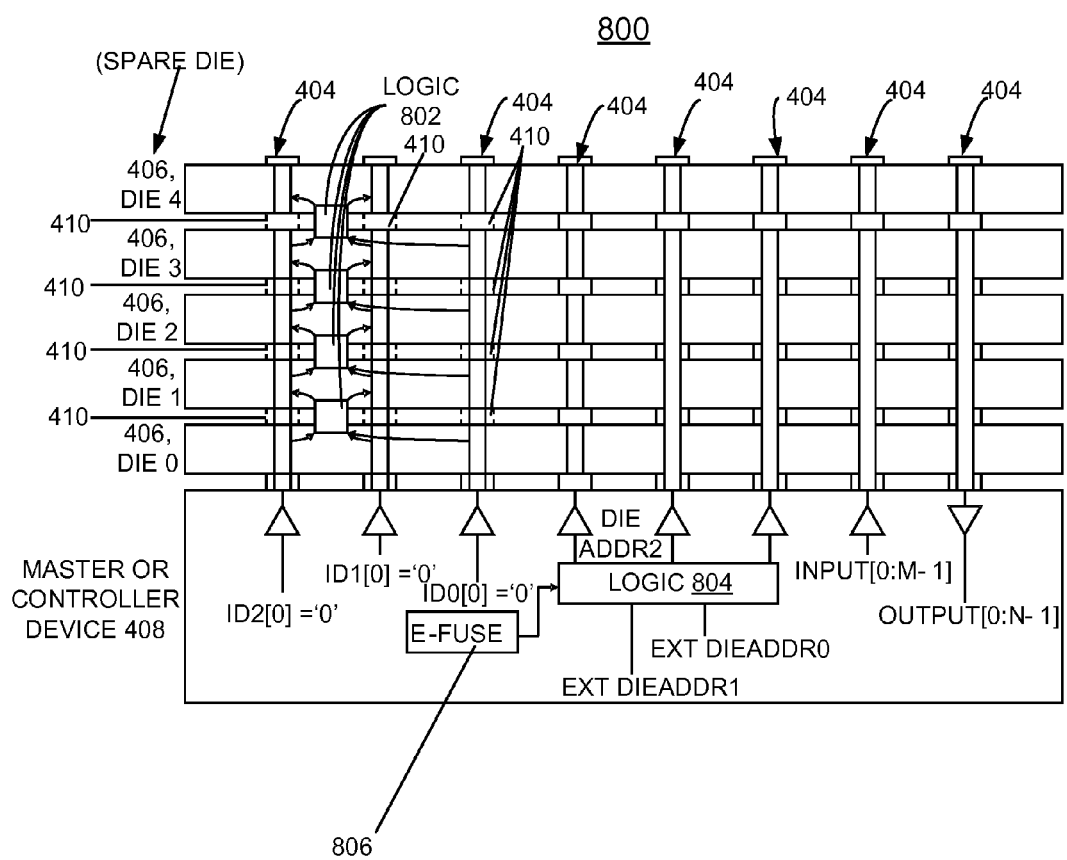
FIG. 8 schematically illustrates an exemplary circuit not to scale for implementing die sparing in through-silicon-via stacked semiconductor devices in accordance with a preferred embodiment.

FIG. 8 schematically illustrates an exemplary circuit not to scale for implementing die sparing in through-silicon-via stacked semiconductor devices generally designated by the reference character 800 in accordance with a preferred embodiment. Circuit 800 includes a distributed logic generally designated by the reference character 802 respectively connected with packaging through silicon via (TSV) interconnections 404.

The logic 802 is distributed across the respective independent stacked integrated circuit die 406, DIE 0, DIE 1, DIE 2, DIE 3, and DIE 4 with the bottom master or controller device 408 in the circuit 800, and sparing logic 804 to implement die sparing, when a de-selected die in the die stack is identified, a spare die in the die stack is used bypassing the identified de-selected die. As shown the independent stacked integrated circuit die 406, DIE 4 is a spare die. A fuse or E-fuse 806 storing the spare die information, such as spare die 406, DIE 4, is coupled to the sparing logic 804 provided with the master semiconductor device 408 in the die stack.

Each die 406, DIE 0, DIE 1, DIE 2, DIE 3, and DIE 4 in the die stack of circuit 800 includes logic 802 for providing die identification, receiving a respective one of three address signal inputs ID2[0]='0', ID1[0]='0' and ID0[0]='0' coupled from the bottom master or controller device 408 and applied to three TSV interconnections 404 that include the dielectric layer 410 electrically separating respective adjacent dies 406, DIE 0, DIE 1, DIE 2, DIE 3, and DIE 4. For example, each stacked integrated circuit die 406, DIE 0, DIE 1, DIE 2, DIE 3, and DIE 4 includes logic 802 containing an identical logic element contributing a partial solution based on state from the coupled die.

The distributed logic 802 is connected to the three TSV interconnections 404 4 as indicated by arrows that include the dielectric layer 410 electrically separating respective adjacent dies 406, DIE 0, DIE 1, DIE 2, DIE 3, and DIE. A plurality of TSV interconnections 404 electrically connected to respective adjacent dies 406, DIE 0, DIE 1, DIE 2, and DIE 3 is connected to a respective signal input DIEADDR2, DIEADDR1, DIEADDR0, applied from sparing logic 804 and INPUT [0:M−1], and OUTPUT [0:N−1] from the bottom master or controller device 408.

FIGS. 9, and 10 illustrate example address logic 802 of the exemplary circuit 800 of FIG. 8 in accordance with a preferred embodiment. In FIG. 9, there is shown example inputs ID2[N], ID1[N] and ID0[N] address bits per each die 406 provided by the logic 802 of FIG. 8.

In FIG. 10, there is shown example external address inputs applied to sparing logic 804 and internal address inputs DIEADDR2, DIEADDR1, DIEADDR0 with die address remapping with die 406, DIE 2 de-selected provided by the logic 802 of FIG. 8.

Figure 11:
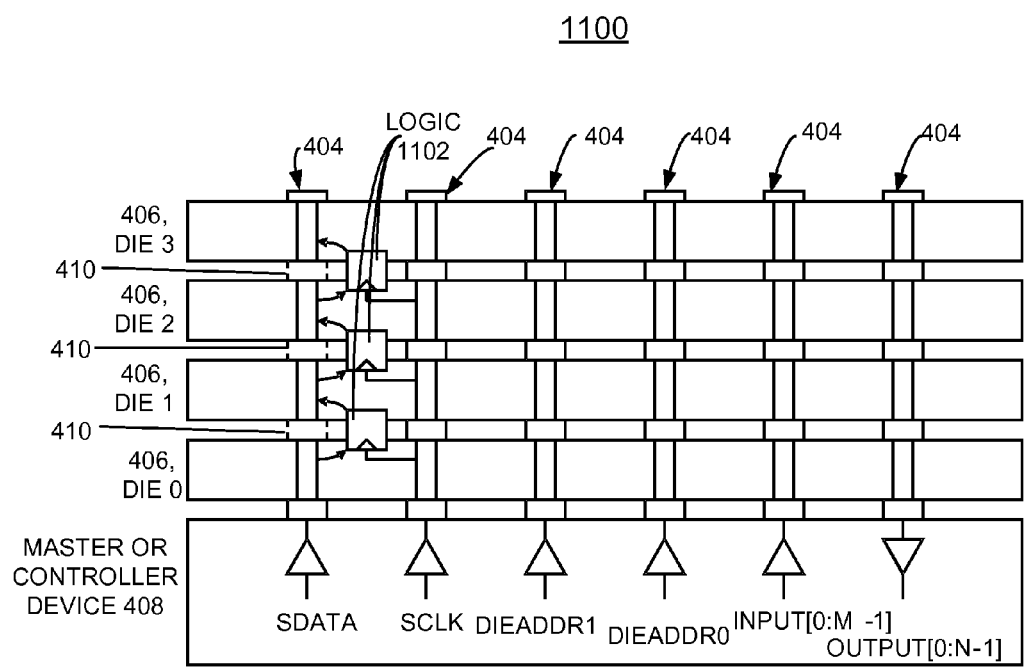
FIG. 11 schematically illustrates an exemplary circuit not to scale for implementing die identification in through-silicon-via stacked semiconductor devices in accordance with a preferred embodiment.

FIG. 11 schematically illustrates an exemplary circuit not to scale for implementing die identification in through-silicon-via stacked semiconductor devices generally designated by the reference character 1100 in accordance with a preferred embodiment. Circuit 1100 includes a distributed logic generally designated by the reference character 1102 respectively connected with packaging through silicon via (TSV) interconnections by the reference character 404. The logic 1102 is distributed across the respective independent stacked integrated circuit die 406, DIE 0, DIE 1, DIE 2, and DIE 3 with the bottom master or controller device 408 in the circuit 400.

Each die 406, DIE 0, DIE 1, DIE 2, and DIE 3 in the die stack of circuit 1100 includes logic 1102 for providing die identification. For example, each stacked integrated circuit die 406, DIE 0, DIE 1, DIE 2, and DIE 3 includes logic 1102 containing an identical logic element contributing a partial solution based on state from the coupled die.

An operational die signature is formed by combining a plurality of selected signals on each die 406, DIE 0, DIE 1, DIE 2, and DIE 3 in circuit 1100, for example, with shift register logic 1102. A die signature is coupled from each respective die 406 to a next level adjacent die 406, for example, from die 406, DIE 0 to a next level adjacent 406, DIE 1, where it is logically combined with that die signature.

As shown, for example, a signal input SDATA coupled from the bottom master or controller device 408 is applied to a first TSV interconnection 404 that include a dielectric layer 410 electrically separating respective adjacent dies 406, DIE 0, DIE 1, DIE 2, and DIE 3. Electrical connections to and from the TSV interconnection 404 receiving signal input SDATA and the logic 1102 included in each die 406, DIE 0, DIE 1, DIE 2, and DIE 3 are indicated by arrows. A plurality of TSV interconnections 404 electrically connected to respective adjacent dies 406, DIE 0, DIE 1, DIE 2, and DIE 3 is connected to a respective signal input SCLK, DIEADDR1, DIEADDR0, INPUT [0:M−1], and OUTPUT [0:N−1] applied from the bottom master or controller device 408. The signal input SCLK is applied to the logic 1102 included in each die 406, DIE 0, DIE 1, DIE 2, and DIE 3 are indicated by arrows.

Figure 12:
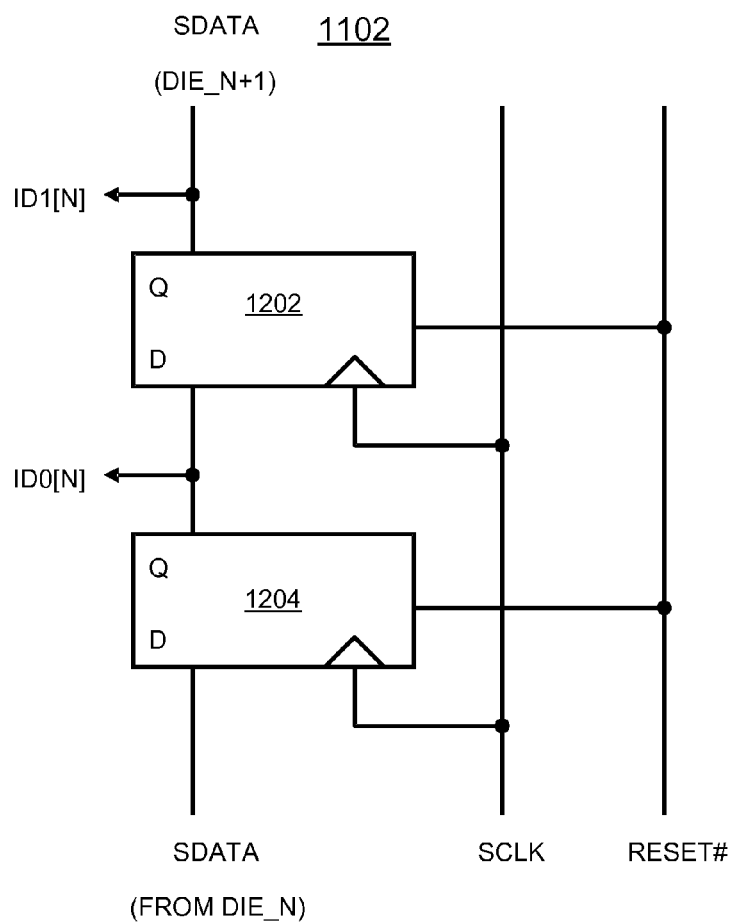
FIGS. 12, and 13 illustrate example logic of the exemplary circuit of FIG. 11 in accordance with a preferred embodiment.
Figure 13:
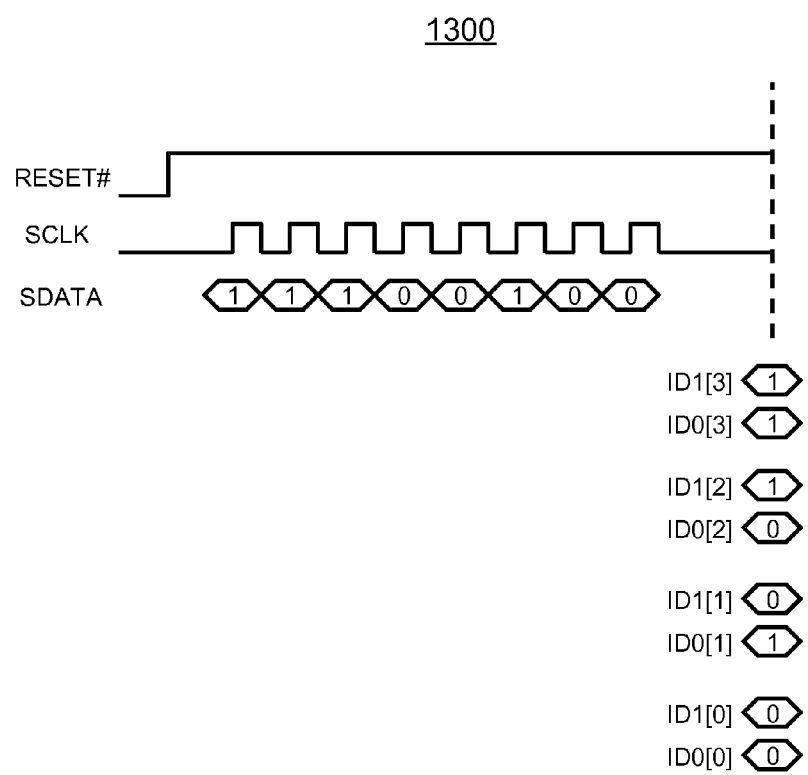

FIGS. 12, and 13 illustrate example logic 1102 of the exemplary circuit 1100 of FIG. 11 in accordance with a preferred embodiment. In FIG. 12 there is shown example combination logic generally designated by the reference character 1102 receiving inputs SDATA and SCLK, and RESET# and providing ID1[N] and ID0[N] outputs SDATA. The combination logic 1102 includes a pair shift registers 1202 respectively receiving inputs SDATA and SCLK, and RESET#, as shown.

Referring to FIG. 13, there is shown example signals SDATA and SCLK, and RESET#, as shown, provided by the logic 1102 of FIGS. 11 and 12.

Figure 14:
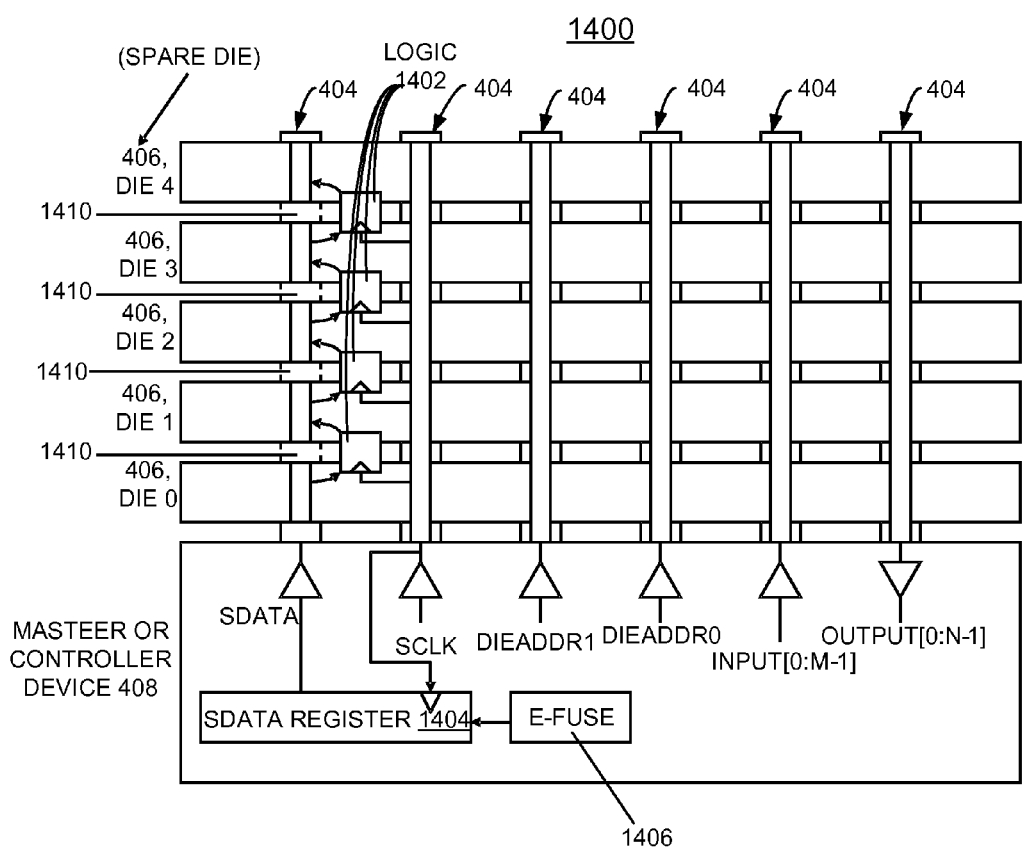
FIG. 14 schematically illustrates an exemplary circuit not to scale for implementing die sparing in through-silicon-via stacked semiconductor devices in accordance with a preferred embodiment.

FIG. 14 schematically illustrates an exemplary circuit not to scale for implementing die sparing in through-silicon-via stacked semiconductor devices generally designated by the reference character 1400 in accordance with a preferred embodiment. Circuit 1400 includes a distributed logic generally designated by the reference character 1402 respectively connected with packaging through silicon via (TSV) interconnections 404.

The logic 1402 is distributed across the respective independent stacked integrated circuit die 406, DIE 0, DIE 1, DIE 2, DIE 3, and DIE 4 with the bottom master or controller device 408 in the circuit 1400, and sparing SDATA register 1404 to implement die sparing, when a de-selected die in the die stack is identified, a spare die in the die stack is used bypassing the identified de-selected die. As shown the independent stacked integrated circuit die 406, DIE 4 is a spare die. A fuse or E-fuse 1406 storing the spare die information, such as spare die 406, DIE 4, is coupled to the sparing SDATA register 1404 provided with the master semiconductor device 408 in the die stack.

Figure 16:
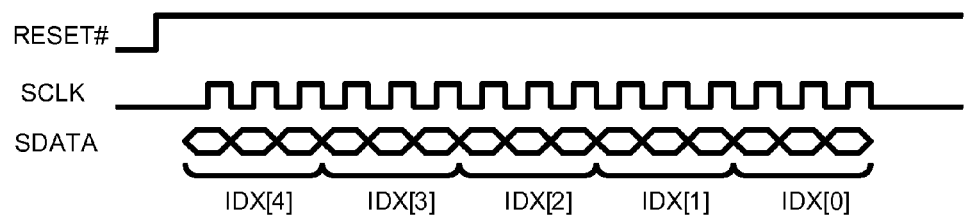

FIGS. 15, 16, 17, and 18 illustrate example operation of SDATA register 1402 of the exemplary circuit 1400 of FIG. 14 in accordance with a preferred embodiment. FIG. 15 illustrates example address example inputs ID2[N], ID1[N] and ID0[N] address bits per each die 406 and address inputs DIEADDR1 and DIEADDR0 with spare die 406, DIE 4 not operated provided by the logic 1402 of the exemplary circuit 1400 in accordance with a preferred embodiment. In FIG. 16, there are shown example signals SDATA and SCLK, and RESET#, provided by the logic 1402 of FIG. 14.

In FIG. 17, there is shown example spare information stored in fuse 1406 and provided to the SDATA register 1404 of FIG. 14. FIG. 18 illustrates example address example inputs ID2[N], ID1[N] and ID0[N] address bits per each die 406 with die 1 replaced with die 4.

Figure 19:
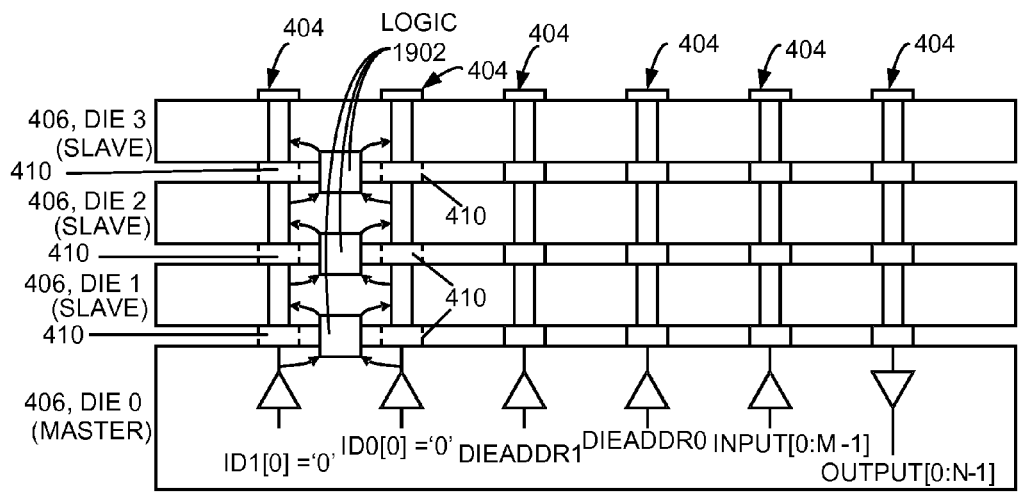
FIG. 19 schematically illustrates an exemplary circuit not to scale for implementing die identification in through-silicon-via stacked semiconductor devices in accordance with a preferred embodiment.

FIG. 19 schematically illustrates an exemplary circuit not to scale for implementing die identification in through-silicon-via stacked semiconductor devices generally designated by the reference character 1900 in accordance with a preferred embodiment. Circuit 1900 includes a distributed logic generally designated by the reference character 1902 respectively connected with packaging through silicon via (TSV) interconnections by the reference character 404. The logic 1902 is distributed across a respective independent stacked integrated circuit die 406, DIE 0, DIE 1, DIE 2, and DIE 3 in the circuit 1900.

In circuit 1900, a master die 406, DIE 0 includes controller die and die 406, DIE 0 merged in this example master-slave structure with slaves die 406, DIE 1, DIE 2, and DIE 3. Each die 406, DIE 0, DIE 1, DIE 2, and DIE 3 in the die stack of circuit 400 includes logic 402 for providing die identification. For example, each stacked integrated circuit die 406, DIE 0, DIE 1, DIE 2, and DIE 3 includes logic 402 containing an identical logic element contributing a partial solution based on state from the coupled die. In a die sparing case replacing DIE 0 with a spare die would provide the array part of DIE 0 not being used, while the controller part of master die 406, DIE 0 would be used.

An operational die signature is formed by combining a plurality of selected signals on each die 406, DIE 0, DIE 1, DIE 2, and DIE 3 in circuit 400. A die signature is coupled from each respective die 406 to a next level adjacent die 406, for example, from die 406, DIE 0 to a next level adjacent 406, DIE 1, where it is logically combined with that die signature.

As shown, for example, a respective signal input ID1[0]='0' and ID0[0]='0' coupled from the merged master die 406, DIE 0 applied to a pair of TSV interconnections 404 that include a dielectric layer 410 electrically separating respective adjacent dies 406, DIE 0, DIE 1, DIE 2, and DIE 3. Electrical connections to and from the pair of TSV interconnections 404 receiving respective signal input ID1[0]='0' and ID0[0]='0' and the logic 1902 included in each die 406, DIE 0, DIE 1, DIE 2, and DIE 3 are indicated by arrows. A plurality of TSV interconnections 404 electrically connected to respective adjacent dies 406, DIE 0, DIE 1, DIE 2, and DIE 3 is connected to a respective signal input DIEADDR1, DIEADDR0, INPUT [0:M−1], and OUTPUT [0:N−1] applied from the merged master die 406, DIE 0.

Figure 20:
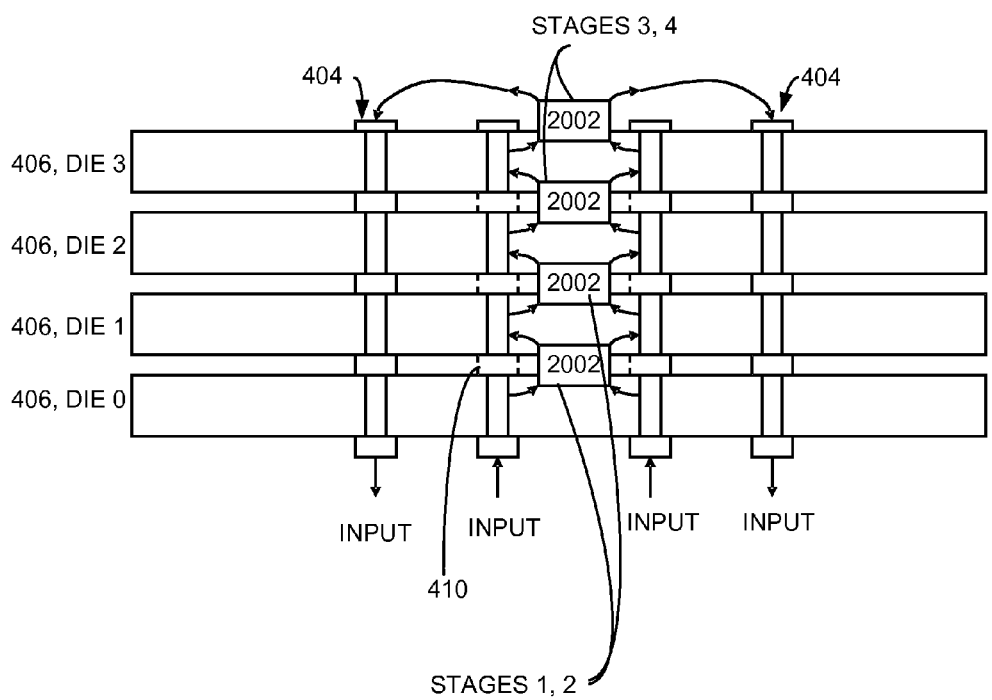
FIG. 20 schematically illustrates an exemplary circuit not to scale for implementing stacking to distribute a logical function over multiple dies in through-silicon-via stacked semiconductor devices in accordance with a preferred embodiment.

FIG. 20 schematically illustrates an exemplary circuit not to scale for implementing stacking to distribute a logical function over multiple dies in through-silicon-via stacked semiconductor devices generally designated by the reference character 2000 in accordance with a preferred embodiment. Circuit 2000 includes a respective distributed logic function or stage generally designated by the reference character 2002 respectively connected with packaging through silicon via (TSV) interconnections by the reference character 404. The respective logic stages 1, 2, 3, and 4, 2002 is distributed across a respective independent stacked integrated circuit die 406, DIE 0, DIE 1, DIE 2, and DIE 3 in the circuit 2000. As shown, for example, a respective signal input is coupled to a pair of TSV interconnections 404 that include a dielectric layer 410 electrically separating respective adjacent dies 406, DIE 0, DIE 1, DIE 2, and DIE 3. A respective result is coupled from each respective die 406 to a next level adjacent die 406, for example, from die 406, DIE 0 to a next level adjacent 406, DIE 1, where it is logically combined with the respective logic function or stage.

Figure 21:
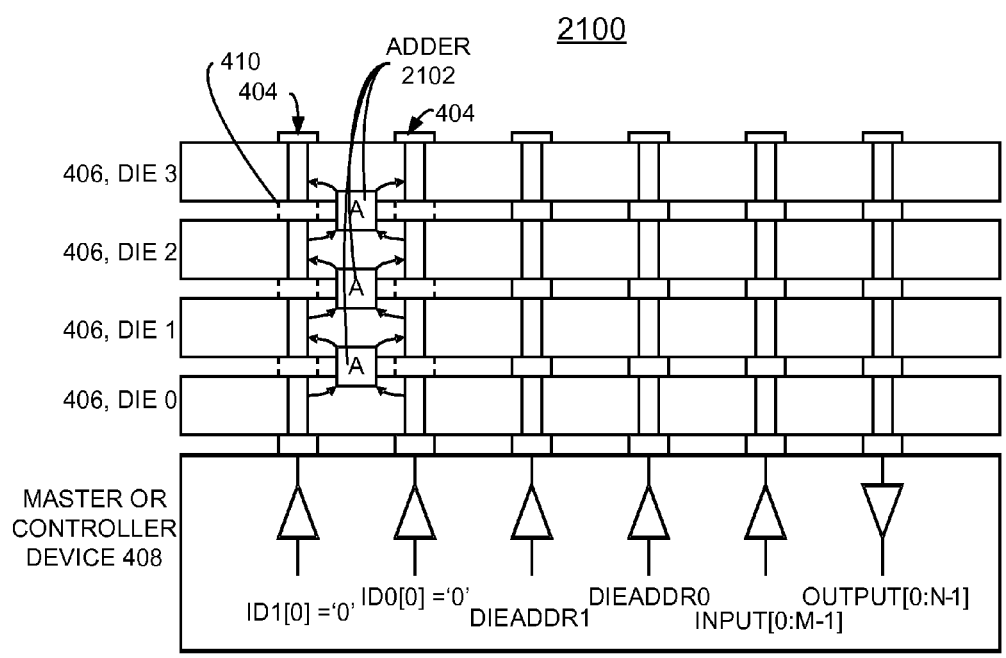
FIG. 21 schematically illustrates an exemplary circuit not to scale for implementing stacking to distribute a logical adder function over multiple dies in through-silicon-via stacked semiconductor devices in accordance with a preferred embodiment.

FIG. 21 schematically illustrates an exemplary circuit not to scale for implementing stacking to distribute a logical adder function over multiple dies in through-silicon-via stacked semiconductor devices generally designated by the reference character 2100 in accordance with a preferred embodiment. Circuit 2100 includes a respective distributed adder function generally designated by the reference character 2102 respectively connected with packaging through silicon via (TSV) interconnections by the reference character 404. The respective logical adder function 2102 is distributed across a respective independent stacked integrated circuit die 406, DIE 0, DIE 1, DIE 2, and DIE 3 in the circuit 2100. As shown, for example, a respective signal input ID1[0]='0' and ID0[0]='0' is coupled to a pair of TSV interconnections 404 that include a dielectric layer 410 electrically separating respective adjacent dies 406, DIE 0, DIE 1, DIE 2, and DIE 3. A respective adder result is coupled from each respective die 406 to a next level adjacent die 406, for example, from die 406, DIE 0 to a next level adjacent 406, DIE 1, where it is logically combined with the respective adder function.

Figure 22:
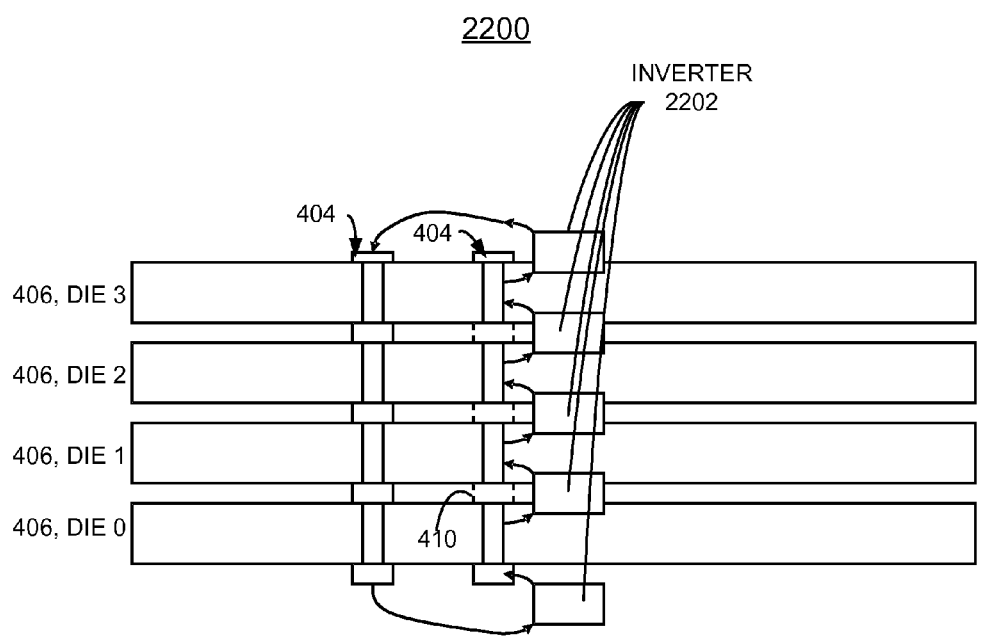
FIG. 22 schematically illustrates an exemplary circuit not to scale for implementing stacking to distribute a logical inverter function over multiple dies to constitute a ring oscillator in through-silicon-via stacked semiconductor devices in accordance with a preferred embodiment.

FIG. 22 schematically illustrates an exemplary circuit not to scale for implementing stacking to distribute a logical inverter function over multiple dies to constitute a ring oscillator in through-silicon-via stacked semiconductor devices generally designated by the reference character 2200 in accordance with a preferred embodiment. Circuit 2200 includes a respective distributed logical inverter function generally designated by the reference character 2202 respectively connected with packaging through silicon via (TSV) interconnections by the reference character 404. The respective logical inverter function 2202 is distributed across a respective independent stacked integrated circuit die 406, DIE 0, DIE 1, DIE 2, and DIE 3 in the circuit 2200. As shown, for example, a respective signal input is coupled to a TSV interconnection 404 that include a dielectric layer 410 electrically separating respective adjacent dies 406, DIE 0, DIE 1, DIE 2, and DIE 3. A respective adder result is coupled from each respective die 406 to a next level adjacent die 406, for example, from die 406, DIE 0 to a next level adjacent 406, DIE 1, where it is logically combined with the respective adder logical inverter function.

Figure 23:
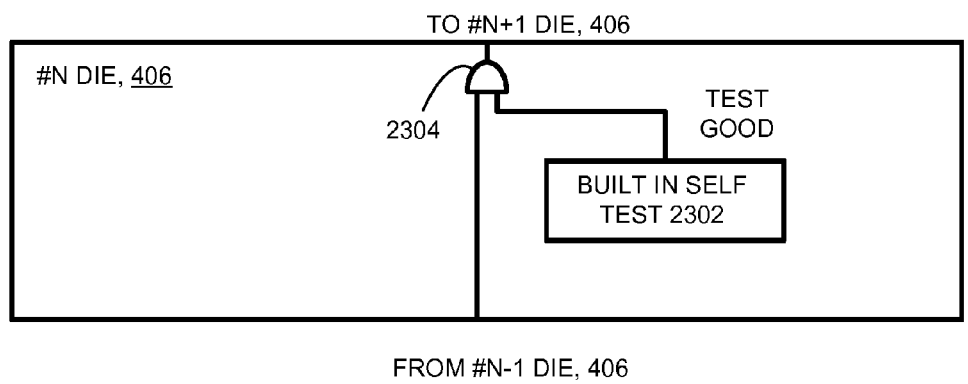
FIG. 23 schematically illustrates an exemplary circuit not to scale for implementing stacking to distribute a logical built-in self-test (BIST) function over multiple dies in through-silicon-via stacked semiconductor devices in accordance with a preferred embodiment.

FIG. 23 schematically illustrates an exemplary circuit not to scale for implementing stacking to distribute a logical built-in self-test (BIST) function over multiple dies in through-silicon-via stacked semiconductor devices generally designated by the reference character 2300 in accordance with a preferred embodiment. Circuit 2300 includes a respective distributed BIST 2302 providing a BIST result, labeled TEST GOOD, and receiving an input from a next level adjacent die 406, #N−1 and respectively connected by a respective logic gate 2304 to a next level adjacent die 406, #N+1 with packaging through silicon via (TSV) interconnections 404 by schematically shown in FIG. 23.

Figure 24:
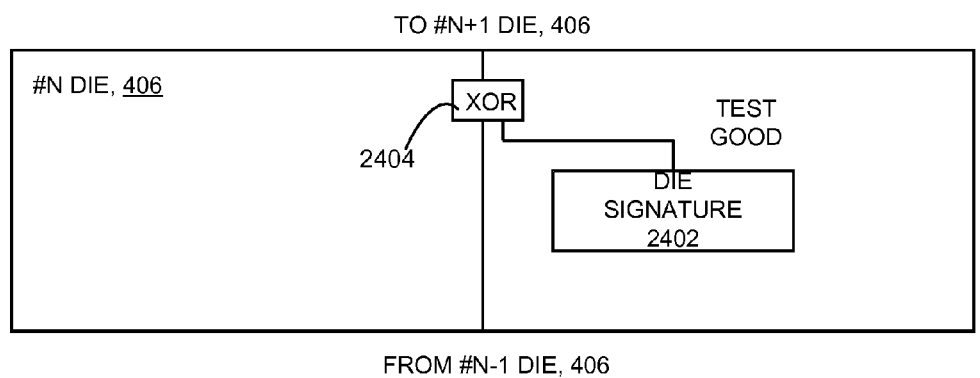
FIG. 24 schematically illustrates an exemplary circuit not to scale for implementing stacking to distribute a logical built-in self-test (BIST) function over multiple dies in through-silicon-via stacked semiconductor devices.

FIG. 24 schematically illustrates an exemplary circuit not to scale for implementing stacking to distribute a logical die signature function over multiple dies in through-silicon-via stacked semiconductor devices generally designated by the reference character 2400 in accordance with a preferred embodiment. Circuit 2400 includes a respective distributed die signature 2402 providing a die signature result, labeled TEST GOOD, and receiving an input from a next level adjacent die 406, #N−1 and respectively connected by a respective logic exclusive or (XOR) gate 2404 to a next level adjacent die 406, #N+1 with packaging through silicon via (TSV) interconnections schematically shown in FIG. 24.

Figure 25:
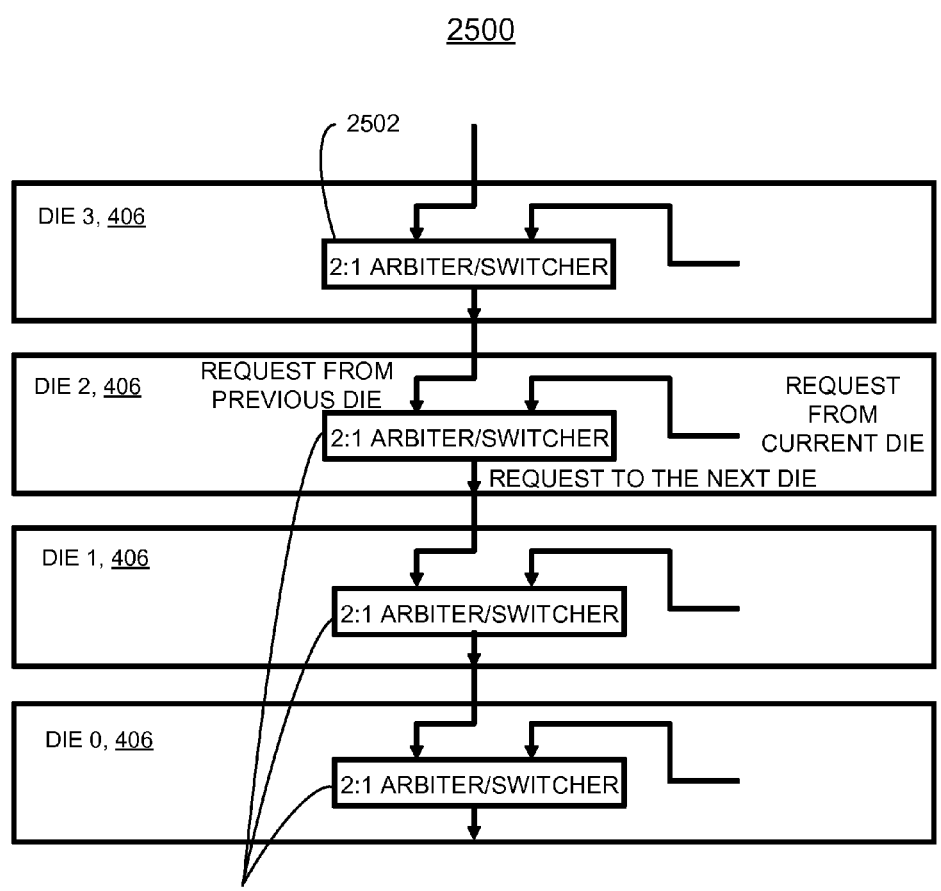
FIG. 25 schematically illustrates an exemplary circuit not to scale for implementing stacking to distribute a logical arbiter or switcher function over multiple dies in through-silicon-via stacked semiconductor devices in accordance with a preferred embodiment.

FIG. 25 schematically illustrates an exemplary circuit not to scale for implementing stacking to distribute a logical arbiter or switcher function over multiple dies in through-silicon-via stacked semiconductor devices generally designated by the reference character 2500 in accordance with a preferred embodiment. Circuit 2500 includes a respective 2:1 arbiter/switcher function 2502 is distributed across a respective independent stacked integrated circuit die 406, DIE 0, DIE 1, DIE 2, and DIE 3 in the circuit 2500. Each respective 2:1 arbiter/switcher function 2502 receiving an input request from an adjacent die 406, #N+1 and an input request from the current die 406, #N and respectively connected by a respective 2:1 arbiter/switcher function 2502 of a next level adjacent die 406, #N−1 with packaging through silicon via (TSV) interconnections 404 schematically shown in FIG. 25.

Figure 26:
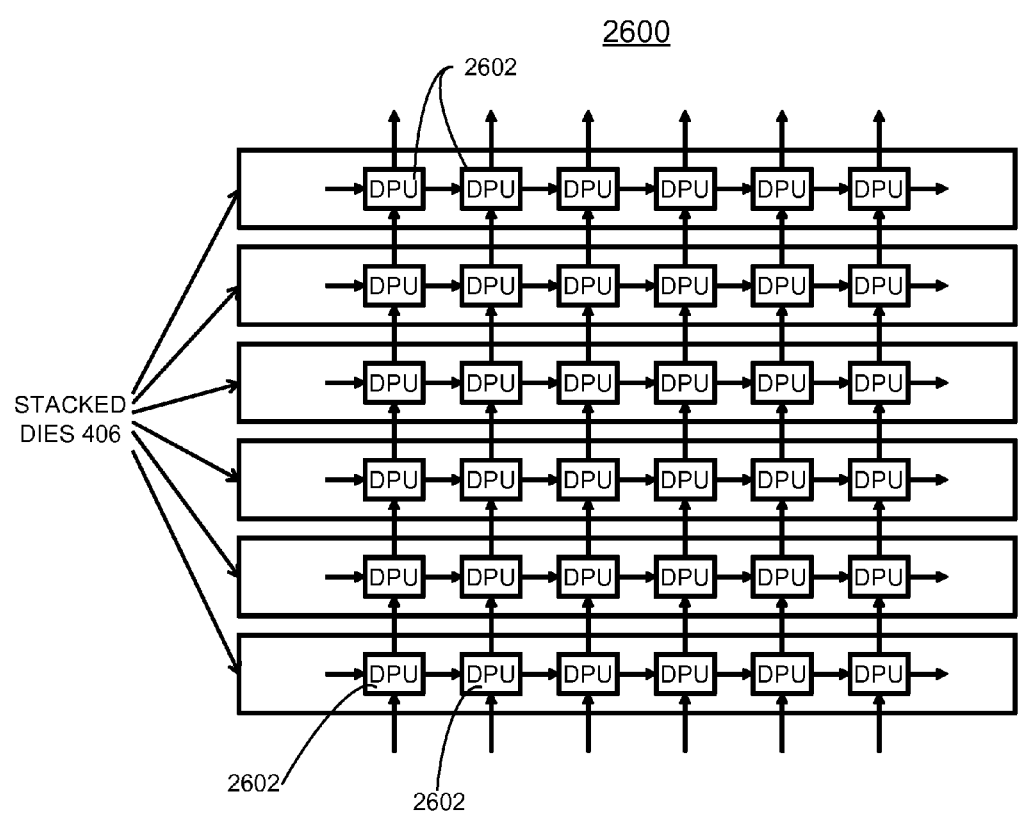
FIG. 26 schematically illustrates an exemplary circuit not to scale for implementing stacking to distribute a logical data processing function over multiple dies in through-silicon-via stacked semiconductor devices in accordance with a preferred embodiment.

FIG. 26 schematically illustrates an exemplary circuit not to scale for implementing stacking to distribute a logical data processing function over multiple dies in through-silicon-via stacked semiconductor devices generally designated by the reference character 2600 in accordance with a preferred embodiment. Circuit 2600 includes a plurality of stacked dies 406. Each die 406 in the die stack circuit 2600 includes a plurality of data processing units 2602. Each respective vertically aligned DPU 2602 is respectively connected by a DPU 2602 of a next level adjacent die 406 with packaging through silicon via (TSV) interconnections 404 schematically shown in FIG. 26.

Figure 27:
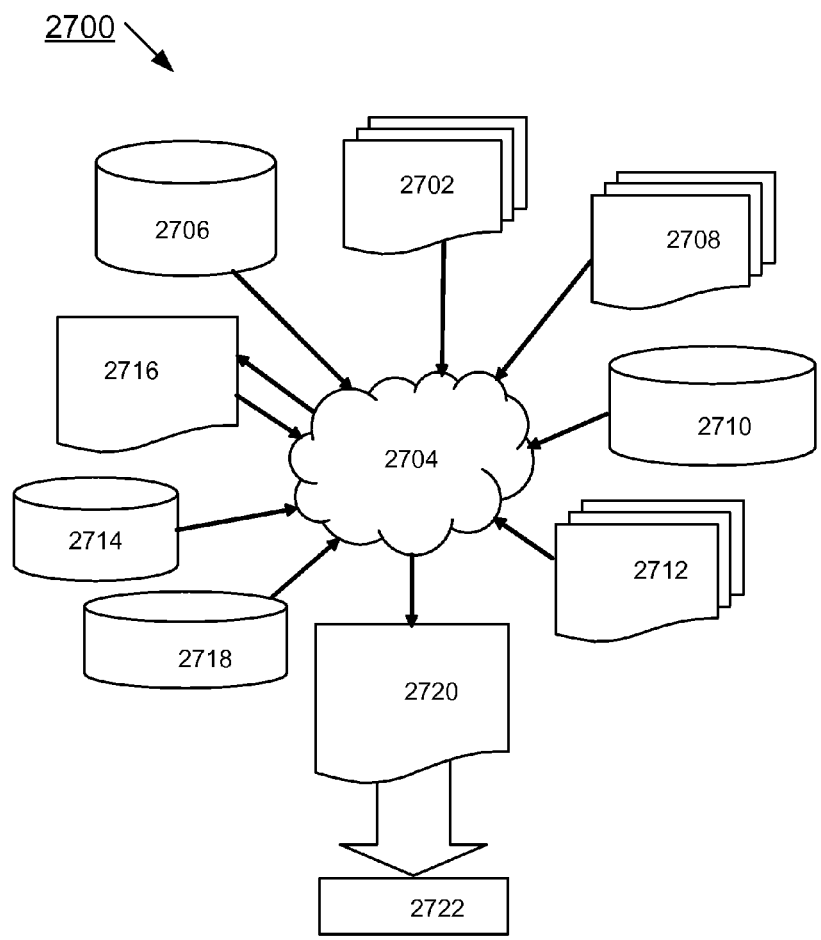
FIG. 27 is a flow diagram of a design process used in semiconductor design, manufacturing, and/or test.

FIG. 27 is a flow diagram of a design process used in semiconductor design, manufacturing, and/or test. FIG. 27 shows a block diagram of an example design flow 2700. Design flow 2700 may vary depending on the type of IC being designed. For example, a design flow 2700 for building an application specific IC (ASIC) may differ from a design flow 2700 for designing a standard component. Design structure 2702 is preferably an input to a design process 2704 and may come from an IP provider, a core developer, or other design company or may be generated by the operator of the design flow, or from other sources. Design structure 2702 comprises circuits 400, 800, 1100, 1400, 1900, 2000, 2100, 2200, 2300, 2400, 2500, and 2600 in the form of schematics or HDL, a hardware-description language, for example, Verilog, VHDL, C, and the like. Design structure 2702 may be contained on one or more machine readable medium. For example, design structure 2702 may be a text file or a graphical representation of circuits 400, 800, 1100, 1400, 1900, 2000, 2100, 2200, 2300, 2400, 2500, and 2600. Design process 2704 preferably synthesizes, or translates, circuit 100 into a netlist 2706, where netlist 2706 is, for example, a list of wires, transistors, logic gates, control circuits, I/O, models, etc. that describes the connections to other elements and circuits in an integrated circuit design and recorded on at least one of machine readable medium. This may be an iterative process in which netlist 2706 is resynthesized one or more times depending on design specifications and parameters for the circuits.

Design process 2704 may include using a variety of inputs; for example, inputs from library elements 2704 which may house a set of commonly used elements, circuits, and devices, including models, layouts, and symbolic representations, for a given manufacturing technology, such as different technology nodes, 42 nm, 45 nm, 90 nm, and the like, design specifications 2710, characterization data 2712, verification data 2714, design rules 2716, and test data files 2718, which may include test patterns and other testing information. Design process 2704 may further include, for example, standard circuit design processes such as timing analysis, verification, design rule checking, place and route operations, and the like. One of ordinary skill in the art of integrated circuit design can appreciate the extent of possible electronic design automation tools and applications used in design process 2704 without deviating from the scope and spirit of the invention. The design structure of the invention is not limited to any specific design flow.

Design process 2704 preferably translates embodiments of the invention as shown in FIGS. 4-26, along with any additional integrated circuit design or data (if applicable), into a second design structure 2720. Design structure 2720 resides on a storage medium in a data format used for the exchange of layout data of integrated circuits, for example, information stored in a GDSII (GDS2), GL1, OASIS, or any other suitable format for storing such design structures. Design structure 2720 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 4-26. Design structure 2720 may then proceed to a stage 2722 where, for example, design structure 2720 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A computer-implemented method for implementing stacking distribution of a logical function over multiple dies in through-silicon-via (TSV) stacked semiconductor devices, a computer performing the steps of said computer-implemented method comprising:

using the computer, providing predefined functional logic for implementing a respective predefined function included in each respective die in a die stack;

arranging each respective die in the die stack for executing the respective predefined function and providing a respective functional result signal output to a next level adjacent die in the die stack using TSV interconnections for combining the respective functional result signal output with the respective predefined functional logic of the next level adjacent die;

providing die identification logic included in each respective die in a die stack; forming an operational die signature by combining a plurality of selected signals on each die; and to provide a die signature to a next level adjacent die in the die stack using TSV interconnections combining the die signature with the die signature of the next level adjacent die; and identifying a de-selected die in the die stack, and using a spare die in the die stack bypassing the identified de-selected die.

2. The computer-implemented method as recited in claim 1 includes providing sparing logic included in the die stack, and storing the spare die information in a fuse coupled to the sparing logic.

3. The computer-implemented method as recited in claim 1 wherein the respective predefined functional logic includes an adder function included on each die.

4. The computer-implemented method as recited in claim 1 wherein the respective predefined functional logic includes an inverter function included on each die.

* * * * *